United States Patent [19]
Narayan et al.

[11] Patent Number: 6,127,721
[45] Date of Patent: *Oct. 3, 2000

[54] SOFT PASSIVATION LAYER IN SEMICONDUCTOR FABRICATION

[75] Inventors: Chandrasekhar Narayan, Hopewell Junction; Bettina Dinkel, Poughkeepsie, both of N.Y.

[73] Assignees: Siemens Aktiengesellschaft, Munich, Germany; International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/940,807

[22] Filed: Sep. 30, 1997

[51] Int. Cl.7 ...................... H01L 27/082; H01L 27/102; H01L 29/70; H01L 31/11
[52] U.S. Cl. .......................... 257/529; 257/530; 257/209
[58] Field of Search .................................... 257/642, 643, 257/751, 752, 529, 530, 209; 438/738, 740

[56] References Cited

U.S. PATENT DOCUMENTS

| | | |
|---|---|---|
| 4,523,372 | 6/1985 | Balda et al. ................................ 29/590 |
| 4,990,993 | 2/1991 | Tsurumaru ................................ 257/643 |
| 5,091,289 | 2/1992 | Cronin et al. ............................ 430/312 |
| 5,173,442 | 12/1992 | Carey ........................................ 437/173 |
| 5,187,119 | 2/1993 | Cech et al. ................................ 437/187 |
| 5,189,506 | 2/1993 | Cronin et al. ............................ 257/752 |
| 5,235,205 | 8/1993 | Lippitt, III ................................ 257/528 |
| 5,371,047 | 12/1994 | Greco et al. .............................. 437/238 |
| 5,444,012 | 8/1995 | Yoshizumi et al. ...................... 438/281 |
| 5,552,638 | 9/1996 | O'Connor et al. ....................... 257/643 |
| 5,652,182 | 7/1997 | Cleeves .................................... 437/195 |
| 5,710,061 | 1/1998 | Cleeves .................................... 437/195 |
| 5,723,381 | 3/1998 | Grewal et al. ........................... 438/633 |
| 5,726,100 | 3/1998 | Givens ...................................... 435/702 |
| 5,754,089 | 5/1998 | Chen et al. .............................. 257/529 |
| 5,821,160 | 10/1998 | Rodriguez et al. ..................... 438/601 |
| 5,955,773 | 9/1999 | Stamper ................................... 257/529 |

*Primary Examiner*—Olik Chaudhuri
*Assistant Examiner*—Phat X. Cao
*Attorney, Agent, or Firm*—Stanton C. Braden

[57] ABSTRACT

The use of an etch stop layer to define a terminal via opening to access a device feature after formation of a photosensitive soft-passivation layer. The etch stop layer allows the size of the terminal via opening to be decoupled from the resolution capabilities of current photosensitive soft-passivation layer.

14 Claims, 2 Drawing Sheets

SOFT PASSIVATION LAYER IN SEMICONDUCTOR FABRICATION

FIELD OF THE INVENTION

The field of the present invention relates generally to semiconductor fabrication and, more particularly, to the soft passivation layers.

BACKGROUND OF THE INVENTION

In device fabrication, insulating, semiconducting, and conducting layers are formed on a substrate. The layers are patterned to create features and spaces. The minimum dimension or feature size (F) of the features and spaces depends on the resolution capability of the lithographic systems and materials used. The features and spaces are patterned so as to form devices, such as transistors, capacitors, and resistors. These devices are then interconnected to achieve a desired electrical function, creating an integrated circuit (IC) or chip.

Fuses are employed to alter interconnections in an IC after standard processing is completed. The ability to alter interconnections gives IC manufacturers flexibility to customize a standard IC design in order to accommodate a customer's specific needs. Fuses have also been used to provide connections to redundancy circuits, replacing defective circuits to improve yield. For example, fuses are used to replace defective word- and/or bit-lines with redundant lines (redundancy activation) in a random access memory (RAM) IC.

One type of fuse, referred to as laser blowable fuses, is typically formed at or near the surface of the IC. A laser beam striking the fuse material renders the fuse portion non-conductive, thereby inhibiting current from flowing through. Laser blowable fuses are widely used because they are relatively simple to fabricate.

The fuses are generally formed on the surface of the IC. The IC and the fuses are covered by a hard and soft passivation layer to protect the devices from the ambient. A barrier layer is provided to isolate the fuse from the soft passivation layer. The soft passivation layer comprises, for example, photosensitive polyimide (PSPI). To access a fuse, an opening is created in the PSPI. The opening is referred to as the terminal via (TV) opening.

Formation of the TV opening is achieved by lithographic techniques. Such techniques include selectively exposing the PSPI with an exposure source and mask. The mask contains a pattern corresponding to TV openings. The PSPI is then cured to render the PSPI thermally stable. After curing, a reactive ion etch (RIE) is performed. The RIE removes the hard passivation and other insulating layers in exposed regions, creating the TV openings to the fuses.

The lithographic resolution of the PSPI, which determines the minimum feature size of the TV, depends on the photosensitive polymers that are currently available. Currently available photosensitive polymers are able to reliably define small TV openings of about 10 um.

In future IC designs, it is important to provide smaller TV openings to enable further miniaturization in chip size. However, currently available PSPI are unable to accomodate advance fuse designs that occupy less area.

As evidenced from the foregoing discussion, it is desirable to enable smaller TV windows to accommodate advance fuse designs which occupy less space.

SUMMARY OF THE INVENTION

The invention relates to formation of a TV opening that is smaller than the resolution capability of current polyimide layer. In accordance with one embodiment of the invention, an etch stop layer is provided over a device feature that is subsequently covered by a photosensitive soft-passivation layer. The etch stop layer is patterned to provide an opening which is sufficient to access the device feature. Using the etch stop layer, the size of opening that is used to access the device feature is decoupled from the lithographic resolution of the photosensitive soft-passivation layer. Instead, the size of the opening is dependent on the lithographic process which is used to pattern the etch stop layer. As such, the opening that is used to access the device feature can be significantly smaller than the opening formed in the photosensitive soft-passivation layer.

BRIEF DESCRIPTION OF THE DRAWINGS

In order to better understand the present invention, reference should be made to the following detailed description and corresponding drawings, wherein.

DETAILED DESCRIPTION OF THE INVENTION

Figure 1:
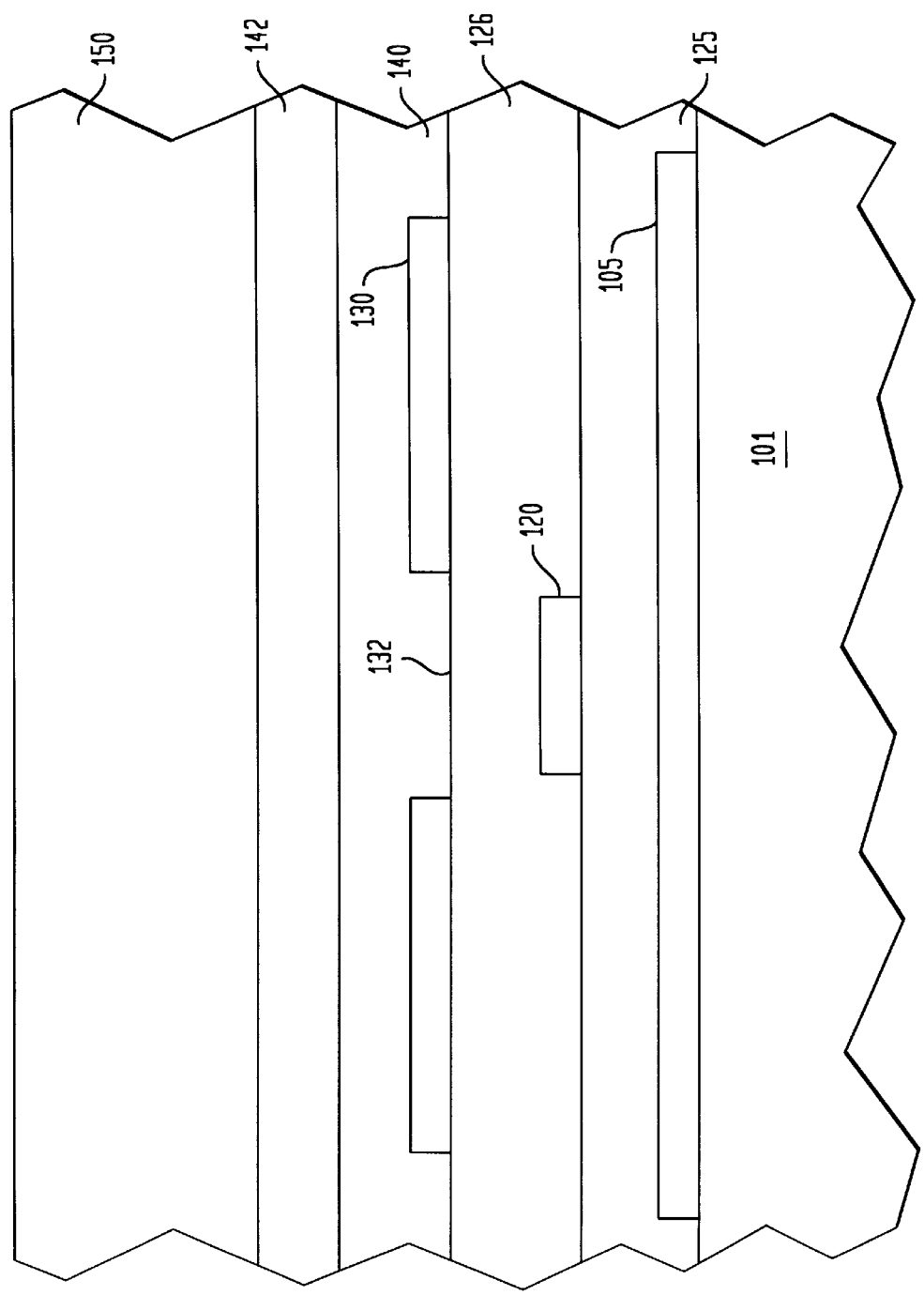
FIGS. 1–2 show one embodiment of the invention for providing TV opening that is smaller than the resolution capabilities of the photosensitive polyimide.
Figure 2:
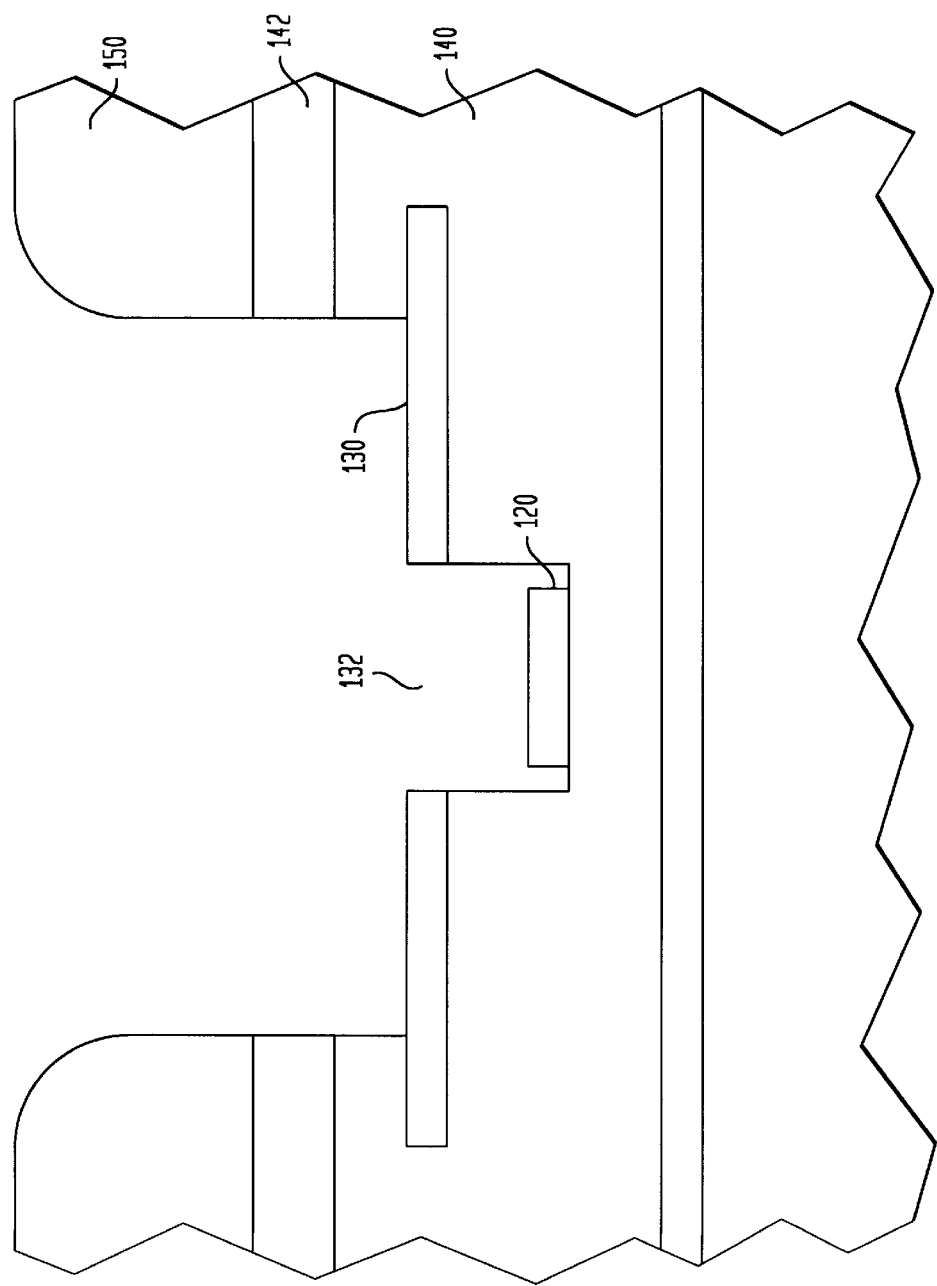

The present invention relates to the formation of TV openings in PSPI. Referring to FIG. 1, a cross-section of a portion of a semiconductor integrated circuit (IC) 100 is shown. The IC, for example, is a memory circuit such as a random access memory (RAM), a dynamic RAM (DRAM), a synchronous DRAM (SDRAM), a static RAM (SRAM), or a read only memory (ROM). Also, the IC may be a logic device such as a programmable logic array (PLA), an application specific IC (ASIC), a merged DRAM-logic IC (embedded DRAM), or any other circuit device.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products.

As shown, the IC comprises devices 105 formed on a substrate 101, which for example is a silicon wafer. Other substrates such as silicon on insulator (SOI), silicon on sapphire (SOS), germanium, gallium arsenide, and group III–V compounds, are also useful. The devices are not shown in detail. In one embodiment, the IC includes a plurality of memory cells such as those employed in a DRAM IC.

Typically, a plurality of device layers are formed over the device. These devices layers include conductive and insulating layers that are patterned to form devices that make up the IC.

Illustratively, a device feature 120 is provided over devices separated by a dielectric layer 125. The dielectric material comprises, for example, silicon dioxide ($SiO_2$, silicon nitride ($Si_3 N_4$) or any other dielectric material. The device feature, for example, represents a fuse used to provide interconnections of underlying devices to achieve a desired electrical function after processing of the IC.

In an illustrative embodiment, a dielectric layer 126 is formed over the device feature 120. The dielectric layer isolates the device feature from, for example, an overlying conductive layer such as that used to form bond pads that provide terminal connections to a lead frame for back-end-of-line (BEOL) processing.

In accordance with the invention, an etch stop layer 130 is provided over the dielectric layer 126. The etch stop layer, in one embodiment, advantageously comprises a conductive layer that is used to form bond pad connections. This allows the etch stop layer to be provided without any additional process steps, thus suffering no penalty in raw process time (RPT).

However, if such conductive layer is not available as part of normal processing, an etch stop layer is deposited over the dielectric layer 126. The etch stop layer comprises, for example, a conductive material such as Al, Cu, W, Mo, or other conductive materials. Other materials in which the materials above and below the etch stop layer can be removed by an etch that is selective thereto are also useful. Typically, this means the etch stop layer comprises a material different from that of the dielectric layer 126 and also of materials formed thereover. For example, the silicon nitride etch stop layer can be used if the overlying layer is silicon oxide and dielectric layer comprise silicon oxide, and vice-versa.

The etch stop layer is patterned to provide an opening positioned above the device feature 120. As shown, the opening is sufficient to allow access to the device feature 120. For example, if the device feature is a laser blowable fuse, the opening is sufficient to enable access by the laser to sever the connection. Typically, the device feature 120 is much smaller than the smallest opening possible with the current PSPI. As such, the opening that is patterned in the etch stop layer is much smaller than the smallest opening possible with current PSPI.

The patterning of the etch stop layer is achieved using conventional lithographic and etch techniques. Such techniques include depositing a layer of photoresist over the etch stop layer and selectively exposing it with an exposure source and mask. Depending on whether a positive or negative resist is used, either the exposed or unexposed portions of the resist layer are removed during development to selectively expose a region of the etch stop layer. The region unprotected by the resist is then etched by, for example, reactive ion etching (RIE) to create opening 132.

A silicon oxide layer 140 and silicon nitride layer 142 are deposited over the surface of the IC, covering the etch stop layer. Layers 140 and 142 serve as hard passivation layers. Typically, the oxide and nitride layers are about 50–800 nm each. Alternatively, if the hard passivation and dielectric layer comprises, for example, silicon oxide, the etch stop layer can be formed from silicon nitride. Also if the dielectric layer and hard passivation layer comprise silicon nitride, the etch stop layer can be formed from silicon oxide.

A soft passivation layer 150 is deposited over the IC. The soft passivation layer serves to protect the IC from ambient contamination. In one embodiment, the soft passivation layer comprises PSPI. Such PSPI includes, for example, Probimide 7000 series manufactured by Olin Microelectronic Materials. Other non-photosensitive polymers such as DuPont 5878 can also be used but will require an extra photopatterning step.

The PSPI is deposited by various deposition techniques such as spin-coating or a curtain coating. Typically, the target thickness of the PSPI is about 6 um after final cure.

After deposition, the PSPI is selectively exposed by an exposure source and mask. The regions of the PSPI exposed to the exposure source become cross-linked and remain after development. The other regions of the PSPI that were not exposed to the light are washed away during development, leaving the desired TV openings. This is a negatively acting PSPI. Positive acting PSPI can also be employed, where the exposed regions are removed during development. As a result, the PSPI serves as an etch mask of a subsequent RIE to form a TV opening to access the device feature 120.

As discussed, the resolution of currently available PSPI is about 10 um. This results in an opening in the PSPI which is significantly greater than that required to access the device feature 120. The RIE removes the exposed portion of the PSPI and various device layers thereunder.

As the RIE continues, the etch stop layers are exposed. The etch stop layers protects materials underneath them from being removed by the RIE. However, the materials unprotected by the etch stop layers in opening 132 are removed by the RIE, exposing device feature 120. As can be seen, the opening created by etch stop layers is smaller than that opening in the PSPI layer.

The provision of the etch stop layers in accordance with the invention allows the TV opening 132 to be decoupled from the resolution capabilities of the PSPI. This enables the TV opening to be much smaller to accommodate smaller fuse banks, for example, advance fuse designs.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

What is claimed is:

1. An integrated circuit comprising:
   a substrate;
   a device feature above the substrate;
   a dielectric layer formed above the device feature;
   an etch stop layer formed above the dielectric layer, the etch stop layer including a first opening formed above the device feature and comprising material which allows the dielectric layer to be removed selective thereto; and
   a soft-passivation layer formed above the etch stop layer and above the first opening in the etch stop layer, the soft-passivation layer including a second opening in the soft-passivation layer, the second opening being larger than the first opening;
   wherein the etch stop layer represents a conductive layer configured to form bond pad connections for the integrated circuit.

2. The integrated circuit of claim 1 wherein the device feature is a laser blowable fuse.

3. The integrated circuit of claim 1 wherein the dielectric layer comprises silicon oxide.

4. The integrated circuit of claim 1 wherein the soft passivation layer is a photosensitive soft passivation layer.

5. The integrated circuit of claim 4 wherein the photosensitive soft passivation layer comprises a photosensitive polyimide (PSPI).

6. The integrated circuit of claim 1 wherein the etch stop layer comprises material from the group consisting of aluminum, copper, tungsten and molybdenum.

7. The integrated circuit of claim 1 further comprising at least one additional layer between the etch stop layer and the soft passivation layer and wherein the second opening extends through the at least one additional layer.

8. An integrated circuit comprising:
   a substrate;

a device feature above the substrate;

a dielectric layer formed above the device feature;

an etch stop layer formed above the dielectric layer, the etch stop layer including a first opening formed above the device feature and comprising material which allows the dielectric layer to be removed selective thereto; and a soft-passivation layer formed above the etch stop layer and above the first opening in the etch stop layer, the soft-passivation layer including a second opening in the soft-passivation layer, the second opening being larger than the first opening;

wherein the etch stop layer represents a conductive layer configured to form bond pad connections larger than the first opening;

further comprising a silicon oxide layer and a silicon nitride layer between the etch stop layer and the soft passivation layer and wherein the second opening extends through the silicon oxide layer and through the silicon nitride layer.

9. The circuit of claim 8 wherein the etch stop layer represents a conductive layer configured to form bond pad connections for the integrated circuit.

10. The integrated circuit of claim 8 wherein the device feature is a laser blowable fuse.

11. The integrated circuit of claim 8 wherein the dielectric layer comprises silicon oxide.

12. The integrated circuit of claim 8 wherein the soft passivation layer is a photosensitive soft passivation layer.

13. The integrated circuit of claim 8 wherein the etch stop layer comprises material from the group consisting of aluminum, copper, tungsten and molybdenum.

14. The integrated circuit of claim 8 further comprising at least one additional layer between the etch stop layer and the soft passivation layer and wherein the second opening extends through the at least one additional layer.

* * * * *